(12) United States Patent
Otsu et al.

(10) Patent No.: US 6,730,578 B2
(45) Date of Patent: May 4, 2004

(54) SEPARATING MACHINE FOR THINNED SEMICONDUCTOR SUBSTRATE AND SEPARATION METHOD

(75) Inventors: Kazuhiro Otsu, Tokyo (JP); Hideki Kobayashi, Tokyo (JP); Tatsuya Sasaki, Tokyo (JP); Kazuhiro Ohya, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/067,370

(22) Filed: Feb. 7, 2002

(65) Prior Publication Data

US 2002/0106869 A1 Aug. 8, 2002

(30) Foreign Application Priority Data

Feb. 7, 2001 (JP) .......................... 2001/030746

(51) Int. Cl.$^7$ .............................. H01L 21/46
(52) U.S. Cl. ...................... 438/459; 438/106
(58) Field of Search .............. 438/459; 225/1, 225/2, 103

(56) References Cited

U.S. PATENT DOCUMENTS 4,352,446 A * 10/1982 Young ..................... 225/1
6,492,195 B2 * 12/2002 Nakanishi et al. .......... 438/106
6,506,664 B1 * 1/2003 Beyne et al. .............. 438/155
2002/0127821 A1 * 9/2002 Ohya et al. ............... 438/459

* cited by examiner

*Primary Examiner*—Huan Hoang
*Assistant Examiner*—Thao P. Le
(74) *Attorney, Agent, or Firm*—Wenderoth, Lind & Ponack, L.L.P.

(57) ABSTRACT

A separating machine for separating a thinned semiconductor substrate from a holding substrate after a semiconductor substrate is bonded to the holding substrate with a thermoplastic resin and a back surface treatment including the thinning of the semiconductor substrate is carried out. The separating machine includes a pair of vacuum adsorption heads for adsorbing the holding substrate-bonded thinned semiconductor substrate from the holding substrate side and from the thinned semiconductor substrate side, which is opposite to the holding substrate side. At least one of the vacuum adsorption heads has a moving means for moving the vacuum adsorption head to adsorb and hold the bonded substrates in a predetermined position together with the other vacuum adsorption head. At least one of the vacuum adsorption heads, has a system for moving the vacuum adsorption head in a single swing direction for separating the bonded substrates after the above adsorption and holding operation is performed.

17 Claims, 2 Drawing Sheets

SEPARATING MACHINE FOR THINNED SEMICONDUCTOR SUBSTRATE AND SEPARATION METHOD

BACKGROUND OF THE INVENTION

1. Field of the Invention

The present invention relates to a separating machine which separates a thinned semiconductor substrate from a holding substrate after the semiconductor substrate has been bonded to the holding substrate with a thermoplastic resin and a back surface treatment, including the thinning of the semiconductor substrate, is carried out. The present invention also relates to a separation method.

2. Description of Related Art

In recent years, electronic devices have been desired to be decreased in thickness or in weight. As is typified by a portable telephone or an IC card, electric devices are decreasing in thickness.

As a thin printed wiring board, printed wiring boards using a wholly aromatic polyamide paper as a base material and printed wiring boards using a polyimide film are increasing.

Further, a ceramic substrate also needs to have a thickness of 0.2 mm or less, 0.1 mm, 0.05 mm, 0.03 mm, etc. However, generally, a ceramic is hard and the shape thereof is not altered. Ceramics other than exceptions such as a flexible thin glass plate have a problem that ceramics crack easily when thinned. For this reason, for example, the maximum work size of a ceramic substrate according to a thin film method is a thickness of 0.2 mm and a size of 50 mm×50 mm.

Similarly, an electronic part itself is decreasing in thickness. The decrease in thickness results from requirements of miniaturization and performance-enhancement.

In view of productivity improvement, developments of a silicon wafer (metal: Si) for enlarging the work size thereof from 8 inches to 12 inches are vigorously being made. Since there is no method for forming electronic circuits including metal on both surfaces concurrently in the current production step, it is required to form electronic circuits on one surface and then form electronic circuits on the other surface. Further, a thermal expansion coefficient difference between metal to be used such as copper or aluminum and a semiconductor substrate is large, e.g., $10\sim15\times10^{-6}K^{-1}$. When electronic circuits are formed on a semiconductor substrate which has been already thinned, warps occur so that in some cases it is impossible to carry out the next step or breakage occurs.

When a semiconductor part in which semiconductor circuits are formed on both surfaces of a thin semiconductor substrate is produced, it is required to adopt a production method in which after the formation of a semiconductor or other electronic circuits at high temperatures, including the introduction of impurities, on one surface (front surface or surface A) of a semiconductor substrate having a general thickness, the above one surface is brought into intimate contact with a holding substrate and held on the holding substrate to protect the one surface, the exposed opposite surface (back surface or surface B) is polished to thin the semiconductor substrate, then semiconductor circuits for the back surface are formed as required, and the semiconductor substrate is separated from the holding substrate and then cut to a chip size or the semiconductor substrate is cut to obtain respective pieces of a chip size and then the respective pieces are separated from the holding substrate.

As a patent concerning the thinning of a semiconductor substrate such as a silicon wafer, there is an example, as shown in JP-A-7-169723, in which wax is heated at 80 to 150° C. and melted on a glass substrate, a wafer is attached to the glass substrate with a press, the wafer is polished, then the wafer on the glass substrate is heated to melt the wax and the wafer and the glass substrate are respectively pulled in directions different from each other to separate the wafer. However, this method can not endure a step of a gold vapor deposition or the like.

Further, as a material used for holding for cutting, an UV irradiation peeling type tape and a heat peeling type tape are commercially available. However, these tapes can not endure a step of a gold vapor deposition or the like.

When the step for forming electronic circuits for the back surface is only a metallization for balancing a thermal expansion coefficient or for maintaining strength, a high temperature treatment step is not specially required. However, when semiconductor circuits are formed, a high temperature of approximately 350° C. or higher is required and it is required to carry out a holding operation under such a vacuum that a plasma treatment or ion plating at the above high temperature is possible.

Further, even when no high temperature treatment is required, the kind of a usable bonding agent or the kind of a holding substrate are greatly limited depending upon chemicals to be used.

Furthermore, since the semiconductor substrate is fragile, there is necessarily required a method which causes no cracks at a step of bonding and,holding the semiconductor substrate to/on the holding substrate and at a step of separating the semiconductor substrate from the holding substrate.

It is extremely difficult to find a means which overcomes the above problems at the same time.

From this respect, for example, when a highly reproducible bond and hold method is developed, a highly reliable bonding and holding restricted to a necessary period of time or a necessary step and a following easy separation are enabled by a selection of conditions. Further, when the range of usable materials for bonding is broadened, the selection possibility of an appropriate balance between necessary physical properties and separability is considerably broadened.

Further, when the practice of each method is established as a more reproducible method requiring any particular skills by developing a device therefor, the road to mass production can be opened.

SUMMARY OF THE INVENTION

It is an object of the present invention to provide a separating machine which can separate a thinned semiconductor substrate from a substrate to which the semiconductor substrate has been bonded without any cracks and a highly reproducible separating method.

According to the present invention, first, there is provided a separating machine for a thinned semiconductor substrate, which separating machine separates a thinned semiconductor substrate from a holding substrate after a semiconductor substrate is bonded to the holding substrate with a thermoplastic resin and a back surface treatment including the thinning of the semiconductor substrate is carried out and which separating machine comprises a pair of vacuum adsorption heads for adsorbing the holding substrate-bonded thinned semiconductor substrate respectively from the holding substrate side and from the thinned semiconductor substrate side opposite to the holding substrate side, wherein at least one of the vacuum adsorption heads has a moving means for adsorbing and holding the holding substrate-bonded thinned semiconductor substrate in a predetermined position together with the other vacuum adsorption head and at least one of the vacuum adsorption heads has a system for moving in a single swing direction for separation after the above adsorption and holding.

Further, in the separating machine for a thinned semiconductor substrate provided according to the present invention, a system for making a starting point (lead) for the separation is provided at the single swing side of the vacuum adsorption head.

Further, in the separating machine for a thinned semiconductor substrate provided according to the present invention, the starting point for the separation is formed at an orientation-flat portion.

Further, in the separating machine for a thinned semiconductor substrate provided according to the present invention, the system for making a starting point for the separation is a system of pressing with a knife edge.

Further, in the separating machine for a thinned semiconductor substrate provided according to the present invention, the system for making a starting point for the separation is composed of a gentle curved surface at at least the single swing side of the vacuum adsorption head and the curved surface adsorbs the holding substrate-attached thinned semiconductor substrate to generate a bending stress.

Secondary, according to the present invention, there is provided a method of separating a thinned semiconductor substrate, comprising bonding and holding a semiconductor substrate to/on the surface of a holding substrate with a thermoplastic resin, carrying out a back surface treatment of the semiconductor substrate, the back surface treatment including the thinning of the semiconductor substrate, and then separating the thinned semiconductor substrate from the holding substrate, wherein the holding substrate-bonded thinned semiconductor substrate is adsorbed and held with a pair of vacuum adsorption heads from the holding substrate side and from the thinned semiconductor substrate side opposite to the holding substrate side, a starting point (lead) for separation from one end side of the bonding portion of the holding substrate-bonded thinned semiconductor substrate is made, and the vacuum head is moved in an opening direction from the starting point (lead) to separate the thinned semiconductor substrate from the holding substrate.

Further, in the method of separating a semiconductor substrate, provided according to the present invention, the holding substrate-bonded thinned semiconductor substrate is immersed in an aqueous solution which is composed of a separating solution containing water as a main ingredient and which has a temperature of 25 to 140° C.

Further, in the method of separating a semiconductor substrate, provided according to the present invention, when an aluminum thin film is present on an exposed portion of the thinned semiconductor substrate, the separating solution contains silicon (Si) in an amount of at least 1 mol/l.

DETAILED DESCRIPTION OF THE INVENTION

Figure 1:
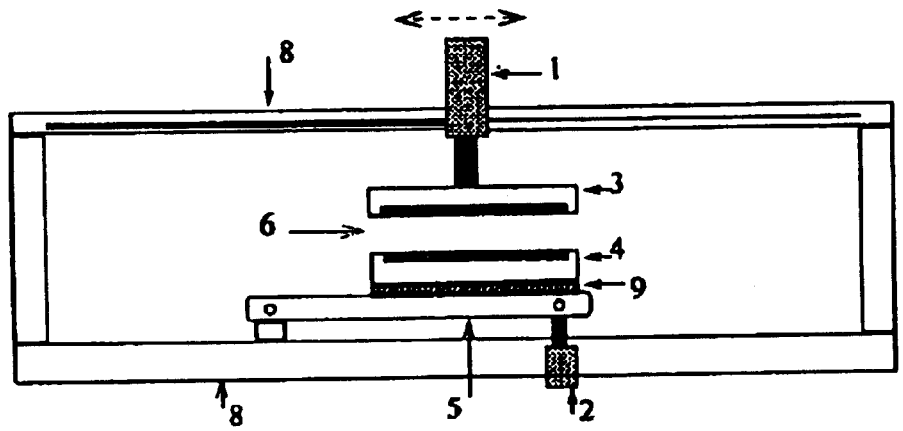
FIG. 1 is a sectional view showing the outline of a separating machine comprising a pair of upper and lower adsorption boards, in which the lower adsorption board has a lower-movable lever arm.

First, an example of the present machine will be concretely explained with reference to drawings.

In the present invention, the reference numerals in the drawings have the following meanings; 1: a main air cylinder, 2: ail assistant air cylinder for processing, 3: an upper adsorption board, 4: a lower adsorption board, 5: a lower-movable lever arm, 6: a bonded-material input aperture, 8: a trestle, 9: a silicon rubber sheet, 11: an upper assistant air cylinder for processing, 12: an upper-movable lever arm, 13: a moving board for pulling an upper adsorption board up, 21: a lower adsorption board having a lifting pin, 22: a lifting pin, 23: a holding substrate, 24: adhesive layer, 25: a thinned wafer, 26: an orientation-flat portion, 27: a vacuum adsorption porous portion, 31: an insertion knife operating part, 32: a processing portion of a holding substrate edge, 41: a convex porous adsorption portion, 42: a lower adsorption board to which the convex porous adsorption portion is attached, 43: a soft porous adsorption portion, and 44: an upper adsorption board to which a soft porous adsorption portion is attached.

Figure 2:
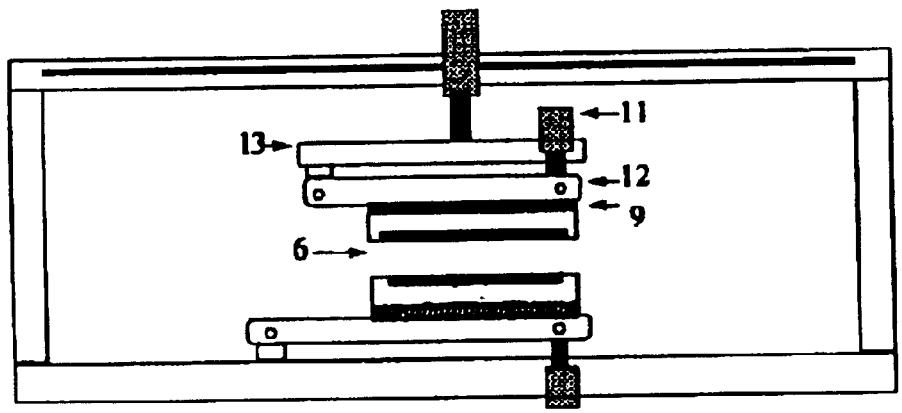
FIG. 2 is a sectional view showing the outline of a separating machine in which each of upper and lower adsorption boards respectively has a movable lever arm.
Figure 3:
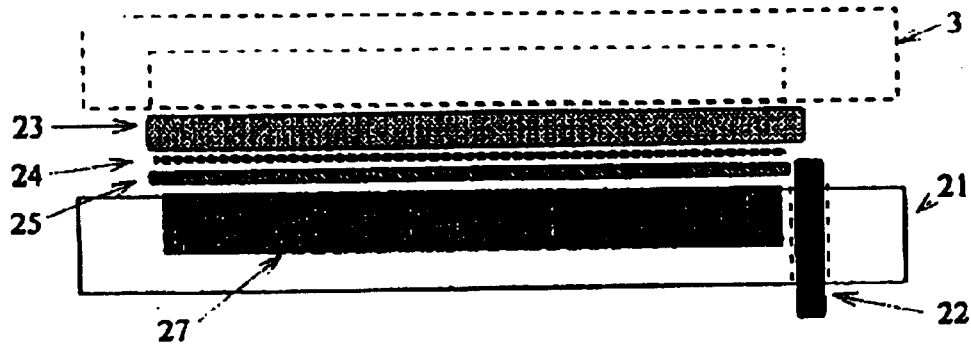
FIG. 3 is a sectional view showing the outline of a separating machine comprising a lower adsorption board having a lifting pin.
Figure 4:
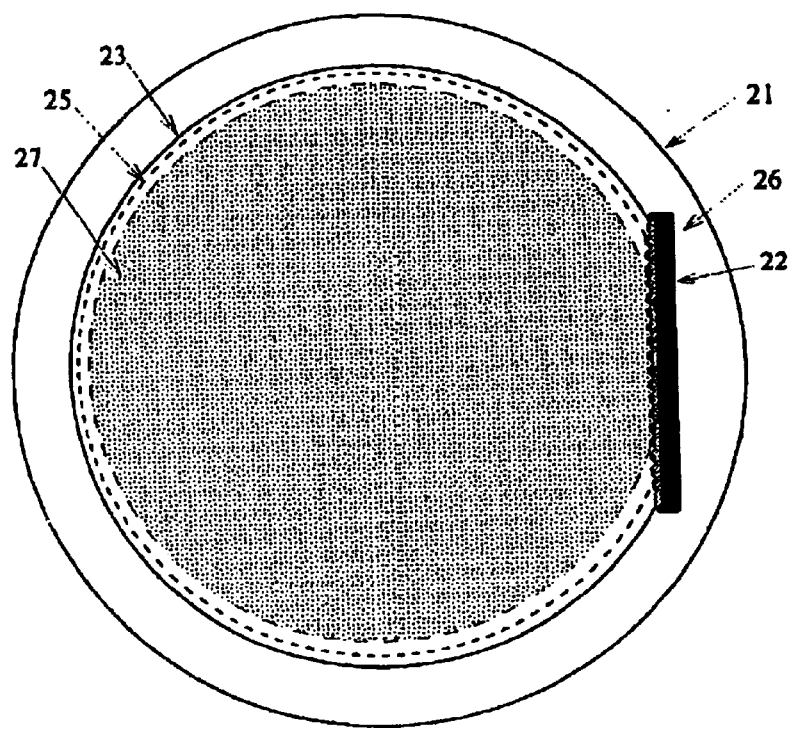
FIG. 4 is a plan view of the machine of FIG. 3.
Figure 5:
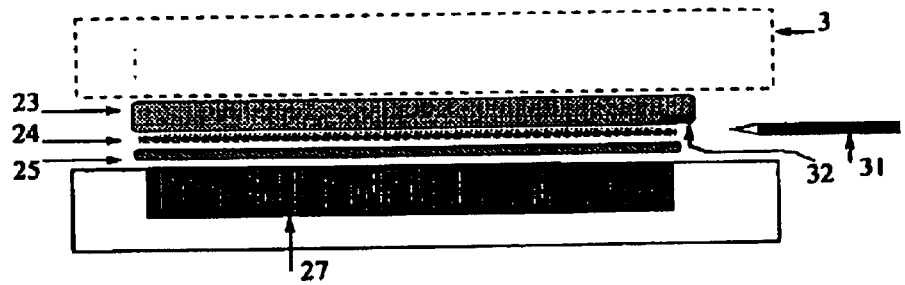
FIG. 5 is a sectional view showing the outline of a separating machine having an insertion knife operating part.
Figure 6:
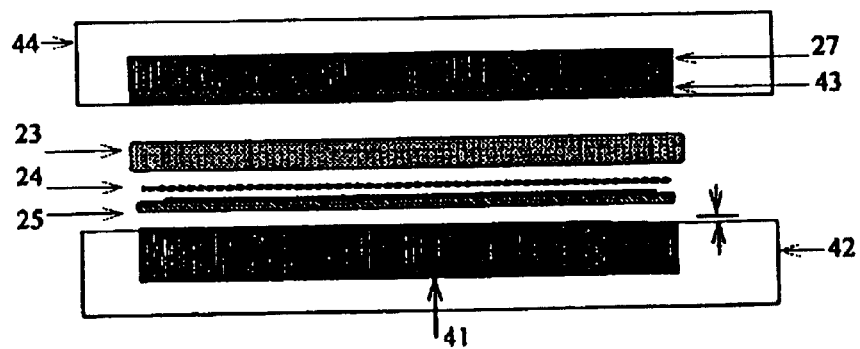
FIG. 6 is a sectional view,showing the outline of a separating machine comprising a lower adsorption board to which a convex porous adsorption portion is attached.

FIG. 1 and FIG. 2 are sectional views showing the outline of the separating machine of the present invention. FIG. 3, FIG. 5 and FIG. 6 are sectional views showing the adsorption portions of the separating machine. FIG. 4 is a plane view of FIG. 3.

In FIG. 1, a holding substrate-bonded thinned semiconductor substrate is disposed at the left side of FIG. 1, and an adsorption board (3) adsorbs the holding substrate-bonded thinned semiconductor substrate at this location. Then the adsorption board (3) moves to a position above an adsorption board (4), and a position adjustment operation is carried out at this location and the adsorption board (3), adsorbing the holding substrate-bonded thinned semiconductor substrate, moves downward such that the adsorption board (4) also adsorbs the holding substrate-bonded thinned semiconductor substrate.

Under a state in which the adsorption boards 3) and 4) sufficiently adsorb the holding substrate-bonded thinned semiconductor substrate, a main cylinder (1) and an air cylinder (2) are operated at the same time. The adsorption board (3) is pulled upward by means of the air cylinder (1). The adsorption board (4) is pulled downward by a force in a single-swing direction from the right edge by means of the air cylinder (2). The adsorption board (4) is fixed to a lower-movable lever arm (5) through the medium of a silicon rubber sheet (9), and the lower-movable lever arm (5) is fixed at the left side such that the lower-movable lever arm (5) can turn freely. As a result, the thinned semiconductor substrate is separated from the holding substrate in such a manner that the point of separation sequentially moves from the right edge to the left side.

In FIG. 2, further, an upper,adsorption board also has a system corresponding to the lower-movable lever arm (5) of FIG. 1. An upper-movable lever arm (12) is fixed to a moving board (18) for pulling an upper adsorption board up at the left end such that the upper-movable lever arm (12) can turn freely. The upper-movable lever arm (12) is fixed to an upper assistant air cylinder (11) for processing at the right end and an adsorption board (3) is fixed to the upper-movable lever arm (12) through the medium of a silicon rubber sheet. As a result, the adsorption board (3) is also able to exert a force in a single-swing direction from the right edge.

FIG. 3 to FIG. 6 show examples in which a system for promoting the separation is added to an adsorption board of the separating machine of the present invention. FIG. 3 and FIG. 4 are a sectional view and a plan view of a case in which a lifting pin (22) is provided on an orientation-flat portion. FIG. 5 is an example in which one end portion of a bonding surface is provided with a holding substrate-edge processing portion (32) and an insertion knife operating part (31) and a lead for the separation is formed by means of a knife edge. In FIG. 6, further, the holding substrate-bonded thinned semiconductor substrate is held on a lower adsorption board such that the holding substrate-bonded thinned semiconductor substrate is slightly curved (for example, difference of elevation: approximately 50~200 μm as a gap between arrows facing each other in FIG. 6) at at least the opening side of the single swing lever arm. A convex-porous-adsorption-attached lower adsorption board (42) is provided with a convex porous adsorption portion (41), and an upper adsorption board enables a stronger slightly-curved holding as a upper adsorption board (44) is attached to a soft porous adsorption portion (43).

The methods shown in the drawing figures may be used in combination as required. The method of FIG. 3 or FIG. 5 and furthermore the method of FIG. 6 can be combined with the method of FIG. 1 or FIG. 2 as required. For example, each of adsorption boards (3) and (4) in FIG. 1 may be provided with a curved surface, as shown in FIG. 6, and a system for forming a lead for separation with a knife-edge, as shown in FIG. 5, can be added. This is an advantageous method in which the curved surface adsorption generates a stress and a physical lead is further formed with the knife-edge.

The holding substrate-bonded thinned semiconductor substrate and the method of promoting a separation, to which the above-described separating machine and separating method of the present invention are applied, are shown in the previous applications of Japanese Patent Application Nos. 2000-194077, 2000-401078, 2000-401077, etc., disclosed by the present inventors. The holding substrate-bonded thinned semiconductor substrate and the method of promoting separation can be preferably used as a material or a means to which a preliminary treatment for promoting the separation has been applied.

These will be explained simply hereinafter.

First, the semiconductor is typified by a silicon (Si) wafer. In addition to the silicon wafer, the semiconductor includes element type semiconductor such as germanium (Ge), selenium (Se), tin (Sn), tellurium (Te), diamond (c) etc., and compound semiconductor such as gallium-arsenic (GaAs), GaP, GaSb, AlP, AlAs, AlSb, InP, InSb, ZnS, ZnSe, ZnTe, CdS, CdSe, CdTe, AlGaAs, GaInAs, AlInAs, AlGaInAs, Sic, etc. These semiconductors can be used as required.

The adhesive properties and separation properties of the above semiconductors are greatly influenced by the kind of treatment formed on the semiconductor surface. The surface treatment includes insulating layers such as a silicon oxide layer, a silicon nitride layer, a silicon nitride-silicone oxide composite layer, polyimide and silicon-modified polyimide layer; an aluminum foil, a copper foil and a gold foil; and metal circuit materials such as tungsten, nickel, chrome and nickel-chrome. In particular, a gold pad and an aluminum pad are used in many cases. Since the aluminum pad easily corrodes because of hot water, acid or alkali, attention is particularly required in a separating step.

As the holding substrate, there is preferably used a material obtained by impregnating an inorganic continuously porous sintered body with a thermosetting resin and curing it.

The inorganic continuously porous sintered body includes aluminum nitride(AlN), aluminum nitride-boron nitride (AlN—h—BN), silicon carbide porous body (SiC), aluminum nitride-silicon carbide-boron nitride (AlN—SiC—h—BN), silicon nitride-boron nitride (SiN—h—BN), alumina-boron nitride ($Al_2O_3$—h—BN), zirconium oxide-alumina-boron nitride ($ZrO_3$—$Al_2O_3$—h—BN), alumina-titanium oxide-boron nitride($Al_2O_3$—$TiO_2$—h—BN), amorphous carbon and carbon fiber reinforced carbon. Examples of the thermosetting resin includes an epoxy resin, a cyanate resin, a polyimide resin and a ladder silicon resin. The polyimide resin or the ladder silicon resin is used by a method in which the steps of impregnating the inorganic continuously porous sintered body with a solution of a polyimide resin or a ladder silicon resin and removing the solvent by drying are repeated at least twice as required.

The thermoplastic resin used for the bonding includes polyimide, polyetherimide, polyamide imide, polyether ketone, polyether ether ketone, polybenzoimidazole and polyamide, and, in addition to these resins, further includes poly-4-methylpentene, ethylene-vinylalcohol copolymer, acrylic or fluorine tetrafluoroethylene-perfluoroalkylyinylether copolymer (PFA), polyvinylidene fluoride (PVDF), tetrafluoroethylene-hexafluoropropylene copolymer (FEP), polychloro-trifluoroethylene (PCTFE) and chlorotrifluoroethylene-ethylene copolymer (E/CTFE). When the above resins are used as they are, generally, polyimide, polyamide or ethylene-vinylalcohol copolymer having a water absorption coefficient of at least 1% is preferred.

These adhesive resins can be preferably variously modified for promoting the bonding or inversely for promoting separating properties at a separation-promoting operation time. For example, there are an improvement in adhesive properties by the incorporation of a soft resin, an improvement in separating properties by a water treatment by the addition of water-absorbing inorganic fine powders and the like.

The method of using the above resins includes (1) a method in which a 10 to 100 μm thick film manufactured beforehand is used, (2) a method in which a resin solution is applied on a holding substrate by a thin film formation method such as spin coating and dried to form an adhesive layer having a thickness of 20 μm or less, more preferably 10 μm or less, or (3) a method in which a resin solution is applied on a holding substrate by screen printing or with a coating machine to form a layer having a thickness of 10 to 50 μm.

As a method for promoting the separation, there is a method in which the holding substrate-bonded semiconductor substrate is immersed in water, aqueous ammonia, amine or a mixed solution of water and amines or a method in which the holding substrate-bonded semiconductor substrate is treated with steam. Furthermore, when a supersonic wave treatment is concurrently carried out in the above separation-promoting step as required, the period of time can be shortened.

For improving water-absorption, heating (25° C. to 140° C.) is preferred.

As the water, pure water is preferred in view of permeability or the pollution prevention of the substrate.

However, it is necessary to avoid the corrosion or dissolution of an exposed portion on the semiconductor circuit surface. For example, when hot water is used in the case where an aluminum circuit is exposed on the surface, it is preferable to use hot water in which silicon (Si) has been already dissolved.

EXAMPLES

The present invention will be explained more in detail with reference to Examples and Comparative Examples hereinafter, in which "%" stands for "% by weight" unless otherwise specified.

Example 1

There was prepared a semiconductor substrate made of a silicon wafer, which semiconductor substrate had aluminum thin film patterns and pads on its surface, had a silicon nitride layer as an insulating material and had a thickness of 0.625 mm and a diameter of 125.0 mm.

A disk of an aluminum nitride-boron nitride porous sintered body which disk had a board thickness of 0.625 mm and a diameter of 125.5 mm was surface-treated by pyrolysis of an organo aluminum compound to improve the compatibility with a resin to be impregnated, the surface-treated disk was impregnated with a resin, the impregnated-resin was cured by vacuum press and the surface of the resin-cured disk was polished so as to attain a surface roughness Ra=0.3 µm, to prepare a holding substrate. A 25 µm thick polyimide film having thermoplastic polyimide layers on both surfaces thereof (trade name: Upilex VT441S, supplied by Ube Industries, Ltd) was temporarily bonded to one surface of the holding substrate.

Separately, a hole having an internal diameter of 130 mm was made in an aluminum alloy having a thickness of 1.2 mm and a size of 250 mm×250 mm to prepare a picture-frame-like frame.

A heat-resistant cushion having a thickness of 2.0 mm and a size of 240 mm×240 mm was sandwiched between two aluminum alloy sheets having a thickness of 0.4 mm and a size of 250 mm×250 mm each, to obtain a cushion set. The above frame was disposed on the above cushion set. The cushion set on which the frame was disposed was fixed to a lower-side heat plate of an air cylinder-pressurization type hot press. Further, similarly, a heat-resistant cushion having a thickness of 2.0 mm and a size of 240 mm×240 mm was sandwiched between two aluminum alloy sheets having a thickness of 0.4 mm and a size of 250 mm×250 mm each to obtain a cushion set, and the cushion set was fixed to an upper-side heat plate. The upper plate descended due to its own weight, to bring the cushion set fixed to the upper heat plate into contact with the frame on the lower cushion set. In this state, these materials were preliminarily heated up to 320° C. and maintained at this temperature.

Then, the upper plate was moved up. A polyimide film having a thickness of 100 µm and a diameter of 125 mm was placed in the inside of the hole for protection. The semiconductor substrate wafer was placed on the polyimide film such that the surface to be polished of the wafer faced downward. The holding substrate was placed on the semiconductor substrate wafer such that the circuits-formed surface of the wafer was brought into contact with the adhesive layer side (thermoplastic polyimide resin side) of the holding substrate. Then, the upper plate side to which a vacuum pan was attached descended due to their own weights and the suction of the air in the vacuum pan was started. Then, a pressure of approximately 3 kPa was applied at a low-pressure setting (0.0475 MPa) of a low-pressure cylinder over 30 seconds, and the above pressure was maintained for 10 seconds. Then, the pressure setting was changed to a medium-pressure setting (2 MPa) of a medium-pressure cylinder, the pressure was increased up to 0.2 MPa over 1 minute, and this pressure was maintained for 14 minutes. The degree of vacuum was 0.1 kPa at the low-pressure time.

After the bonding operation, a nitrogen gas was introduced to cool and to increase the pressure up to atmospheric pressure. The upper plate was moved up and the integrated wafer and holding substrate was taken out.

The surface of the obtained silicon wafer/holding substrate was ground to a silicon thickness of 100 µm with a horizontal grinding machine (supplied by Okamoto Machine Tool Works, Ltd, trade name: GRIND, number of revolutions: 400 rpm) using a diamond blade #320 and then ground to a silicon thickness of 84 µm with the horizontal surface grinding machine using a diamond blade #1,200.

Then, the silicon wafer/holding substrate was processed to a silicon thickness of 80 µm by a chemically polishing-processing with a lapping machine for CMP (chemi-mechanical polishing) (supplied by Okamoto Machine Tool Works, Ltd, trade name: GRIND-X, SPL15T, number of revolutions: 600 rpm, load: 7 kg) using a mat (Rodelnita, tradename: Suba #600) and a CMP solution (supplied by Okamoto Machine Tool Works, Ltd, trade name: S005). The surface roughness Ra became 0.02 µm.

After the wafer/holding substrate was washed with a hydrogen fluoride-nitric acid solution and then pure water, gold was deposited with a spattering instrument (supplied by Sanyu Electronics) for the formation of metal circuits on the back surface of the wafer. A heat treatment was carried out at 360° C. for 1 hour in nitrogen in a heat treatment furnace. Before the deposition of the gold, a covering treatment was carried out in an area having a width of 3.0 mm from the periphery of the silicon wafer such that the gold was not deposited on the periphery, the adhesive layer and exposed portions of the holding substrate.

Then, the separating step was carried out.

Pure water was poured into a vessel made of quartz and heated up to 80° C. The obtained thinned-semiconductor-attached holding substrate was immersed in the pure water in the vessel for 1 hour, then the thinned-semiconductor-attached holding substrate was taken out, the thinned-semiconductor-attached holding substrate was immersed in pure water at room temperature and cooled, and the water of the thinned-semiconductor-attached holding substrate was drained. Then, the thinned-semiconductor-attached holding substrate was placed in the separating machine of FIG. 1.

The thinned-semiconductor-attached holding substrate was sufficiently vacuum-adsorbed from each of the thinned semiconductor side and the holding substrate side. Then, a main air cylinder and an assistant air cylinder for processing were operated at low speeds at the same time. As a result, the thinned semiconductor substrate and the holding substrate having the adhesive layer were separated with the thinned semiconductor substrate being adsorbed to the upper adsorption board and with the holding substrate being adsorbed to the lower adsorption board. The vacuum adsorption was terminated and the thinned semiconductor substrate having a thickness of 80 µm was taken out. The thinned semiconductor substrate had no defective appearance.

Example 2

The semiconductor substrate used in Example 1 was replaced with a semiconductor substrate having a thickness of 0.625 mm and a diameter of 150.0 mm and having an oxide layer as an insulating layer. The raw material for the holding substrate used in Example 1 was replaced with an aluminum nitride-boron nitride porous sintered body having a thickness of 0.625 mm and a diameter of 150.5 mm. A groove having a width of 5 mm and a depth of 25 µm was made in the holding substrate in a position corresponding to the orientation-flat portion of the silicon wafer. The same polyimide film in kind as that in Example 1 was embedded in the groove and the same polyimide film in kind was temporally attached to the entire surface. The frame used in Example 1 was replaced with a frame having a size corresponding to these sizes. The medium-pressure setting of the medium-pressure cylinder of the hot press for bonding in Example 1 was changed from 2 MPa to 2.4 MPa. The press pressure in Example 1 was changed from 0.20 MPa to 0.16 MPa. A thinned semiconductor-substrate-bonded holding substrate was obtained in the same manner as in Example 1 except for the above changes.

In the separating step, the same separation-promoting treatment as in Example 1 was carried out except that the thinned-semiconductor-attached holding substrate was immersed in a 28% aqueous ammonia for 20 minutes before it was immersed in the pure water having a temperature of 80° C.

Thereafter, Example 1 was repeated except that the separating machine was replaced with the separating machine of FIG. 5. The vacuum-adsorption was terminated and a thinned semiconductor substrate having a thickness of 80 µm and having no defective appearance was taken out.

Example 3

The semiconductor substrate used in Example 1 was replaced with a semiconductor substrate which had gold thin film patterns and pads on the surface of a gallium-arsenic wafer, had a polyimide layer as an insulating layer and had a board thickness of 0.625 mm and a diameter of 100.0 mm. Further, the holding substrate used in Example 1 was replaced with a holding substrate obtained by surface-treating an aluminum oxide-boron nitride porous sintered body disk having a board thickness of 0.625 mm and a diameter of 125.0 mm by pyrolysis of an organoaluminum compound, impregnating the surface-treated disk with a resin, curing the impregnated resin by vacuum press and polishing the surface of the disk until the surface roughness Ra became 0.3 µm. A thermoplastic polyamide resin (nylon 6) having a thickness of 25 µm was temporally attached to one surface of the above-obtained holding substrate. Further, the thinning was carried out by grinding and CMP until the thickness became 50 µm.

Bonding, grinding and CMP, and separation were carried out in the same manner as in Example 1 except for the above changes. A thinned semiconductor substrate having a thickness of 50 µm and having no defective appearance was taken out.

The present invention is directed to a separating method applied when a semiconductor substrate is bonded to an inorganic substrate made of ceramic and then the semiconductor substrate is thinned. Particularly, the separating method of the present invention can also be applied when metal circuits are formed on the ground back surface by sputtering at a high vacuum or a high temperature treatment at 350 to 400° C. After the back surface is processed, the semiconductor substrate is separated and the holding substrate can be reused. Therefore, the separating method of the present invention is a novel processing method having a high level of productivity and has great significance.

What is claimed is:

1. A separating machine for separating a thinned semiconductor substrate from a holding substrate after the thinned semiconductor substrate has been bonded to the holding substrate with a thermoplastic resin and a back surface treatment including the thinning of the semiconductor substrate has been carried out, the separating machine comprises a pair of vacuum adsorption heads for adsorbing the holding substrate-bonded thinned semiconductor substrate from a holding substrate side and from a thinned semiconductor substrate side, respectively, wherein the thinned semiconductor substrate side is disposed opposite relative to the holding substrate side, wherein at least one of the vacuum adsorption heads has a moving means for adsorbing and holding the holding substrate-bonded thinned semiconductor substrate in a predetermined position together with the other vacuum adsorption head, and at least one of the vacuum adsorption heads has a system for moving in a single swing direction to separate the holding substrate from the thinned semiconductor substrate.

2. A separating machine according to claim 1, wherein a system for making a separation starting point is provided at a single swing side of the vacuum adsorption head.

3. A separating machine according to claim 2, wherein the separation starting point is formed at a flat orienting portion.

4. A separating machine according to claim 2, wherein the system for making a separation starting point includes a structure having a knife edge.

5. A separating machine according to claim 2, wherein the system for making a separation starting point is composed of a gentle curved surface at at least the single swing side of at least one of the vacuum adsorption heads, and the curved surface adsorbs the holding substrate-attached thinned semiconductor substrate to generate a bending stress therein.

6. A separating machine according to claim 3, wherein the system for making a separation starting point includes a structure having a knife edge.

7. A separating machine for separating a thinned semiconductor substrate from a holding substrate after the substrates have been bonded with a thermoplastic resin and a back surface treatment including thinning of the semiconductor substrate has been carried out, said separating machine comprising:

a first vacuum adsorption head for adsorbing and holding the bonded substrates; and a second vacuum adsorption head for adsorbing and holding the bonded substrates in cooperation with said first vacuum head, wherein at least one of said first and second vacuum adsorption heads is movable toward and away from a bonded substrate holding position;

wherein at least one of said first and second vacuum adsorption heads is a pivotable vacuum adsorption head and includes a mechanism for pivoting a side of said pivotal vacuum adsorption head away from the bonded substrate holding position to separate the holding substrate from the thinned semiconductor substrate.

8. A separating machine according to claim 7, further comprising a device for initiating a separation starting point is provided at the movable side of said pivotal vacuum adsorption head.

9. A separating machine according to claim 8, wherein at least one of the first and second vacuum adsorption heads includes a flat orienting portion.

10. A separating machine according to claim 7, further comprising a knife member having a knife edge for initiating a separation starting point, wherein said knife member is provided at the movable side of said pivotal vacuum adsorption head.

11. A separating machine according to claim 7, wherein at least one of the first and second vacuum adsorption heads includes a convex curved surface for contacting the bonded substrates to generate a bending stress therein.

12. A separating machine for separating a thinned semiconductor substrate from a holding substrate after the substrates have been bonded with a thermoplastic resin and a back surface treatment including thinning of the semiconductor substrate has been carried out, said separating machine comprising:

an upper adsorption board for adsorbing and holding the bonded substrates;

an upper moving mechanism for moving said upper adsorption board toward and away from a bonded substrate holding position;

a lower adsorption board for adsorbing and holding the bonded substrates in cooperation said upper adsorption board, said lower adsorption board being supported so as to be pivotal about one side thereof; and a lower moving mechanism for moving said lower adsorption board so as to pivot said lower adsorption board in a single swing direction, wherein said upper and lower adsorption boards are capable of adsorbing and holding the bonded substrates in the bonded substrate holding position, and then moving away from the bonded substrate holding position to separate the holding substrate from the thinned semiconductor substrate.

13. A separating machine according to claim 7, wherein said upper moving mechanism is operable to move the bonded substrate to a position over said lower adsorption board, and then a position adjusting operation is performed.

14. A separating machine according to claim 7, wherein said upper adsorption board is connected to an upper lever arm which is pivotally connected to a movable board, where said separating machine further comprises an upper mechanism for pivoting said upper level arm in a single swing direction.

15. A separating machine according to claim 7, wherein said an upper moving mechanism is connected to said movable board.

16. A separating machine according to claim 7, further comprising a device for initiating a separation between the holding substrate and the thinned semiconductor substrate.

17. A separating machine according to claim 16, wherein said separation initiating device comprises a knife structure.

* * * * *